United States Patent
Ishiyama

[11] Patent Number: 5,926,072
[45] Date of Patent: Jul. 20, 1999

[54] FM MODULATOR USING A MONOSTABLE MULTIVIBRATOR

[75] Inventor: Yukio Ishiyama, Kanagawa-ken, Japan

[73] Assignee: Alps Electric Co., Ltd., Tokyo, Japan

[21] Appl. No.: 08/982,940

[22] Filed: Dec. 2, 1997

[30] Foreign Application Priority Data

Dec. 3, 1996 [JP] Japan .................................. 8-322882

[51] Int. Cl.⁶ ...................................................... H03C 3/02
[52] U.S. Cl. ............................ 332/101; 332/102; 332/135
[58] Field of Search ...................................... 332/100, 101, 332/102, 123, 135; 375/302, 303; 455/110

[56] References Cited

U.S. PATENT DOCUMENTS 3,732,506  5/1973  Dupuy ...................................... 332/108

FOREIGN PATENT DOCUMENTS 61-227406  10/1986  Japan .

*Primary Examiner*—Siegfried H. Grimm
*Attorney, Agent, or Firm*—Brinks Hofer Gilson & Lione

[57] ABSTRACT

A frequency modulation circuit includes an emitter-follower connection transistor (2), having a base supplied with a modulation signal, for generating an emitter voltage which is in proportion to a modulation signal level; and an integrated mono-stable multi-vibrator (1) having an inversion trigger terminal ((A*)), a non-inversion trigger terminal (B), a resister/capacitor terminal ($R_x/C_x$), a capacitor terminal ($C_x$), complementary output terminals (Q, (Q*)), and the like. The inversion trigger terminal ((A*)) is connected to the complementary output terminal (Q), the non-inversion trigger terminal (B) is connected to a partial voltage point of partial voltage resistors (10, 11), the capacitor/resistor terminal ($R_x/C_x$) is connected to the emitter of the transistor (2) through a resistor (3) and connected to the capacitor terminal ($C_x$) through a capacitor (4), a load (13) is connected to the complementary output terminal ((Q*)), and the emitter of the transistor is driven by a second power supply (15) which generates a voltage higher than a voltage from a first power supply (14) applied to the mono-state multivibrator.

3 Claims, 7 Drawing Sheets

| INPUTS | | | OUTPUTS | | NOTE |
|---|---|---|---|---|---|
| $\overline{A}$ | B | $\overline{CLR}$ | Q | $\overline{Q}$ | |
| ⎤_ | H | H | _⎡⎤_ | ⎤_⎡ | OUTPUT ENABLE |
| X | L | H | L | H | INHIBIT |
| H | X | H | L | H | INHIBIT |
| L | _⎡ | H | _⎡⎤_ | ⎤_⎡ | OUTPUT ENABLE |
| L | H | _⎡ | _⎡⎤_ | ⎤_⎡ | OUTPUT ENABLE |
| X | X | L | L | H | RESET |

X : DON'T CARE

FM MODULATOR USING A MONOSTABLE MULTIVIBRATOR

BACKGROUND OF THE INVENTION

1. Field of the Invention

The present invention relates to a frequency modulation circuit and, more particularly, to a frequency modulation circuit in which an integrated mono-stable multi-vibrator and an emitter-follower connection transistor driven by a high power supply voltage are used, and the influence of a variation in frequency caused by noise is reduced.

2. Description of the Related Art

As a conventional mono-stable multi-vibrator circuit, a circuit constituted by an integrated mono-stable multi-vibrator is known.

Here, FIG. 4A is a view showing an arrangement of an integrated mono-stable multi-vibrator used in a known mono-stable multi-vibrator circuit, and FIG. 4B is a truth table obtained when the integrated mono-stable multi-vibrator operates.

This integrated mono-stable multi-vibrator 30 is constituted by a very-high-speed CMOS mono-stable multi-vibrator using a silicon gate CMOS technique. In the integrated mono-stable multi-vibrator 30, first and second basic circuits 31 and 32 having the same circuit arrangements are parallelly arranged to be connected to each other. The mono-stable multi-vibrator is available from Toshiba Corp. as model number TC74VHC123AF/AFS or TC74VHC221AF/AFS.

As shown in FIG. 4A, in the integrated mono-stable multi-vibrator 30, the first basic circuit 31 has an inversion trigger terminal 1(A*), a non-inversion trigger terminal 1B, an inversion clear terminal 1(CLR*), a resistor/capacitor terminal $1R_X/C_X$, a capacitor terminal $1C_X$, and complementary output terminals 1(Q*) and 1Q; and the second basic circuit 32 has an inversion trigger terminal 2(A*), a non-inversion trigger terminal 2B, an inversion clear terminal 2(CLR*), a resistor/capacitor terminal $2R_X/C_X$, a capacitor terminal $2C_X$, and complementary output terminals 2(Q*) and 2Q. In addition, although not shown in FIG. 3, the integrated mono-stable multi-vibrator 30 has a power supply terminal $V_{CC}$ and a ground terminal GND which are shared by the first and second basic circuits 31 and 32.

Note that, of the numerical symbols added to the respective terminals of the integrated mono-stable multi-vibrator 30, a numerical symbol with brackets and mark * represents that an inversion sign is added to the symbol in the brackets. In the following description, when symbols added to respective constituent elements have inversion signs, these symbols are represented in the same manner as described above.

The first and second basic circuits 31 and 32 are triggered when the fall edge of a trigger input is applied to the inversion trigger terminal 1(A*) and the inversion trigger terminal 2(A*). On the other hand, the first and second basic circuits 31 and 32 are triggered when the rise edge of a trigger input is applied to the non-inversion trigger terminal 1B and the non-inversion trigger terminal 2B. The trigger inputs applied to the inversion trigger terminal 1(A*) and the non-inversion trigger terminal 1B and the trigger inputs applied to the inversion trigger terminal 2(A*) and the non-inversion trigger terminal 2B constitute schmidt trigger inputs.

FIG. 5 is a view showing an arrangement of a main part of a mono-stable multi-vibrator circuit constituted by the first basic circuit 31 or the second basic circuit 32 of the integrated mono-stable multi-vibrator 30 shown in FIG. 4A. FIG. 6 is a waveform chart showing changes in signal of the respective portions when the mono-stable multi-vibrator circuit shown in FIG. 5 operates.

In this case, referring to FIG. 5, the mono-stable multi-vibrators constituted by the first basic circuit 31 and the second basic circuit 32 have the same circuit arrangements. For this reason, only the portion of the mono-stable multi-vibrator circuit using the first basic circuit 31 is illustrated, and the second basic circuit 32 is omitted in FIG. 5. The same reference numerals as in FIG. 4 denote the same parts in FIG. 5. However, with respect to numerical symbols added to the respective terminals of the first basic circuit 31, number 1 representing the first basic circuit 31 is omitted, and the terminals are represented by only the symbols.

As shown in FIG. 5, in the first basic circuit 31 of the integrated mono-stable multi-vibrator 30, a resistor 33 and a diode 33D (if necessary) are connected between the resistor/capacitor terminal $R_X/C_X$ and the power supply $V_{CC}$, and a capacitor 34 is connected between the resistor/capacitor terminal $R_X/C_X$ and the capacitor terminal $C_X$, thereby constituting a mono-stable multi-vibrator circuit as a whole.

The operation of the mono-stable multi-vibrator circuit with the above arrangement will be described below with reference to FIG. 6.

In a period between time $t_0$ and $t_1$, when the inversion trigger terminal 1(A*) and the non-inversion trigger terminal 1B are at low level (L) and high level (H), respectively, the resistor/capacitor terminal $R_X/C_X$ is set in a high-impedance state. For this reason, the power supply terminal $V_{CC}$ is applied to the circuit, and the complementary output terminal Q and the complementary output terminal (Q*) are at low level (L) and high level (H), respectively.

At time $t_1$, when the rise edge of a trigger input is supplied to the non-inversion trigger terminal B, the resistor/capacitor terminal $R_X/C_X$ shifts to a low-impedance state, and a voltage sharply drops from the power supply terminal $V_{CC}$. At this time, the complementary output terminal Q and the complementary output terminal (Q*) shift to high level (H) and low level (L), respectively.

When it is time $t_1'$, and the voltage of the resistor/capacitor terminal $R_X/C_X$ gradually decreases to exceed a low-voltage-side set voltage VrefL which is set in the first basic circuit 31 in advance, the resistor/capacitor terminal $R_X/C_X$ shifts to the high-impedance state again. As a result, the voltage gradually increases by a CR time constant determined by the resistor 33 and the capacitor 34.

At time $t_2$, when the voltage of the resistor/capacitor terminal $R_X/C_X$ gradually increases to reach a high-voltage-side reference voltage VrefH which is set in the first basic circuit 31 in advance, the complementary output terminal Q and the complementary output terminal (Q*) shift to low level (L) and high level (H), respectively. However, the voltage of the resistor/capacitor terminal $R_X/C_X$ continuously increases by the CR time constant determined by the resistor 33 and the capacitor 34 subsequently.

At time $t_3'$, when the fall edge of a trigger input is supplied to the inversion trigger terminal (A*), the resistor/capacitor terminal $R_X/C_X$ shifts to a low-impedance state, and the voltage sharply decreases. At this time, the complementary output terminal Q and the complementary output terminal (Q*) also shift to high level (H) and low level (L), respectively.

When it is time $t_3'$, the voltage of the resistor/capacitor terminal $R_X/C_X$ gradually decreases to exceed the low-voltage-side reference voltage VrefL, the resistor/capacitor terminal $R_X/C_X$ shifts to a high-impedance state as in the case described above, and the voltage gradually increases by the CR time constant determined by the resistor 33 and the capacitor 34.

At time $t_4$, when the voltage resistor/capacitor terminal $R_X/C_X$ gradually increases to reach a high-voltage-side reference voltage VrefH, the complementary output terminal Q and the complementary output terminal (Q*) shift to low level (L) and high level (H), respectively. The voltage of the resistor/capacitor terminal $1R_X/C_X$ continuously increases by the CR time constant determined by the resistor 33 and the capacitor 34.

At time $t_5$, when the fall edge of a trigger input is supplied to the inversion trigger terminal (A*), the same operation as that performed at time $t_3$ described above is executed. Thereafter, the same operation as that at time $t_3'$ described above is executed, and the same operation as described above is repetitively executed.

When the above operations are executed, a mono-stable signal of a negative polarity which is kept in only a period $t_w$out can be output from the complementary output terminal (Q*).

Subsequently, FIG. 7 is a circuit diagram showing a known frequency modulation circuit constituted by the mono-stable multi-vibrator circuit shown in FIG. 5. The same reference numerals as in FIG. 5 denote the same parts in FIG. 7.

As shown in FIG. 7, the frequency modulation circuit is constituted in such a manner that an emitter-follower connection transistor 35 is coupled to the integrated mono-stable multi-vibrator 30. The transistor 35 has: a base connected to a modulation signal source 37 through a coupling capacitor 36 and connected to base-bias resistors 38 and 39; a collector directly grounded; and an emitter connected to a power supply terminal 41 through an emitter resistor 40. In the integrated mono-stable multi-vibrator 30, the resistor/capacitor terminal $R_X/C_X$ is connected to the emitter of the transistor 35 through the resistor 33 and connected to a capacitor terminal $C_X$ through the capacitor 34, the inversion trigger terminal (A*) is connected to the complementary output terminal Q, and the non-inversion trigger terminal B is connected to the voltage setting resistors 42 and 43 and a bypass capacitor 44. The inversion clear terminal (CLR*) and the power supply terminal $V_{CC}$ are connected to the power supply terminal 41, and the capacitor terminal $C_X$ is grounded. A D flip-flop 45 has: a clock terminal $C_K$ connected to the complementary output terminal (Q*) of the integrated mono-stable multi-vibrator 30; a delay terminal D connected to the complementary output terminal (Q*); and a complementary output terminal Q connected to a signal output terminal 46.

The frequency modulation circuit with the above arrangement operates in the following manner.

When a modulation signal is supplied from the modulation signal source 37 to the base of the emitter-follower connection transistor 35 through the coupling capacitor 36, the modulation signal is current-amplified by the transistor 35, and a voltage (to be referred to as a modulation signal dependent voltage hereinafter) which is proportional to the level of the modulation signal is generated by the emitter of the transistor 35. The modulation signal level dependent voltage is applied to the resistor/capacitor terminal $R_X/C_X$ (in a high-impedance state) of the integrated mono-stable multi-vibrator 30 through the resistor 33. In the integrated mono-stable multi-vibrator 30, a logic level H depending on the partial voltage ratio of the voltage setting resistor 42 to the voltage setting resistor 43 is applied to the non-inversion trigger terminal B. When the modulation signal dependent voltage is supplied from the transistor 35, the voltage of the resistor/capacitor terminal $R_X/C_X$ set in a high-impedance state gradually increases by a charge time constant of the modulation signal dependent voltage determined by the resistor 33 and the capacitor 34. At this time, the complementary output terminal Q and the complementary output terminal (Q*) are at high level (H) and low level (L), respectively.

Here, when the voltage of the resistor/capacitor terminal $R_X/C_X$ gradually increases to reach a set voltage VrefH (this set voltage VrefH is set by a power supply voltage and the integrated mono-stable multi-vibrator 30) applied to the non-inversion trigger terminal B, the state of the resistor/capacitor terminal $R_X/C_X$ is converted into a low-impedance state, and the voltage of the resistor/capacitor terminal $R_X/C_X$ sharply decreases. In addition, the level of the complementary output terminal Q is converted from high level (H) to low level (L), and the level of the complementary output terminal (Q*) is converted from low level (L) into high level (H).

When the voltage of the resistor/capacitor terminal $R_X/C_X$ decreases to the low-voltage-side set voltage (low-voltage-side reference voltage) VrefL equal to a low-level (L) voltage applied from the complementary output terminal Q to the inversion trigger terminal (A*), the state of the resistor/capacitor terminal $R_X/C_X$ is converted into a high-impedance state, and the voltage of the resistor/capacitor terminal $R_X/C_X$ gradually increases by a charge time constant of a modulation signal dependent voltage determined by the resistor 33 and the capacitor 34. In addition, the level of the complementary output terminal Q is converted from low level (L) into high level (H), and the level of the complementary output terminal (Q*) is converted from high level (H) into low level (L).

Thereafter, when the voltage of the resistor/capacitor terminal $R_X/C_X$ reaches the high-voltage-side set voltage VrefH, the voltage begins to sharply decrease, and the polarities of the levels of the complementary output terminal Q and the complementary output terminal (Q*) are inverted. Subsequently, when the voltage of the resistor/capacitor terminal $R_X/C_X$ reaches a low-voltage-side set voltage VrefL, the voltage gradually increases by a charge time constant determined by the resistor 33 and the capacitor 34. The operation that the polarities of the levels of the complementary output terminal Q and the complementary output terminal (Q*) are inverted again is repetitively executed.

The D flip-flop 45 is triggered by the rise edge of a pulse supplied from the complementary output terminal (Q*), and a pulse whose polarity is inverted each time the D flip-flop 45 is triggered by the rise edge of an input pulse from the complementary output terminal Q is supplied to the signal output terminal 46.

In this case, since the voltage of the resistor/capacitor terminal $R_X/C_X$ gradually increases by the charge time constant of the modulation signal dependent voltage determined by the resistor 33 and the capacitor 34, a time until the voltage of the resistor/capacitor terminal $R_X/C_X$ reaches the high-voltage-side set voltage VrefH is short when the modulation signal dependent voltage is high, a low-level (L) period of time of a pulse output from the complementary output terminal (Q*) becomes short. On the other hand, a time until the voltage of the resistor/capacitor terminal $R_X/C_X$ reaches the high-voltage-side set voltage VrefH is long when the modulation signal dependent voltage, and a low-level (L) period of a pulse output from the complementary output terminal (Q*) becomes long. A pulse output from the complementary output terminal Q of the D flip-flop 45 becomes a signal frequency-converted by the modulation voltage of the modulation signal source 37.

In the above known frequency modulation circuit, when the voltage of the resistor/capacitor terminal $R_X/C_X$ gradually increases by the charge time constant of a modulation signal dependent voltage determined by the resistor 33 and the capacitor 34 to reach a high-voltage-side set voltage VrefH, the level of a pulse output from the complementary output terminal (Q*) is converted from low level (L) into high level (H), and the conversion timing is dependent on the modulation signal level. For this reason, a pulse signal frequency-modulated by a modulation signal can be extracted from the complementary output terminal (Q*). However, since the high-voltage-side set voltage VrefH is set by a power supply voltage and the characteristics of the integrated mono-stable multi-vibrator 30, induction noise may be superposed on the high-voltage-side set voltage VrefH.

In the known frequency modulation circuit, when induction noise is superposed on the high-voltage-side set voltage VrefH, the level of the high-voltage-side set voltage VrefH varies depending on the polarity and level of the induction noise. For this reason, the timing at which the gradually increasing voltage of the resistor/capacitor terminal $R_X/C_X$ reaches the high-voltage-side set voltage VrefH varies depending on the polarity and level of the induction noise. As a result, a timing at which the level of a pulse output from the complementary output terminal (Q*) is converted from low level (L) into high level (H) also varies depending on the polarity of and level of the induction noise, and a pulse signal which is correctly frequency-modulated by the modulation signal cannot be extracted disadvantageously.

SUMMARY OF THE INVENTION

The present invention has been made to solve the above problem, and has as its object to provide a frequency modulation circuit in which a modulation error of a frequency modulation signal based on induction noise superposed on a high-voltage-side set voltage of an integrated mono-stable multi-vibrator is reduced.

In order to solve the above object, a frequency modulation circuit according to the present invention having an integrated mono-stable multi-vibrator and an emitter-follower connection transistor, comprises a means for making a power supply voltage for driving the emitter of a transistor higher than a power supply voltage for driving the integrated mono-stable multi-vibrator when a modulation signal dependent voltage obtained from the emitter of the transistor is applied to the integrated mono-stable multi-vibrator through a time constant determined by a resistor and a capacitor to generate a frequency modulation signal corresponding to the modulation signal dependent voltage.

According to this means, when the modulation signal dependent voltage is applied to the integrated mono-stable multi-vibrator in the form of an increasing voltage through the time constant determined by the resistor and the capacitor, even if induction noise is superposed on the high-voltage-side set voltage of the integrated mono-stable multi-vibrator, the power supply voltage for driving the emitter of the transistor is set high. For this reason, the modulation signal dependent voltage increases, and the increase rate of the increasing voltage becomes high. More specifically, since an inclination angle at which the increasing voltage crosses the high-voltage-side set voltage on which induction noise is superposed increases, the increasing voltage is easily influenced by the variation in the high-voltage-side set voltage on which the induction noise is superposed when the increasing voltage reaches the high-voltage-side set voltage to convert the level of the complementary output terminal. Therefore, the modulation error of the frequency modulation signal is reduced.

DESCRIPTION OF THE PREFERRED EMBODIMENT

An embodiment of the present invention will be described below with reference to the accompanying drawings.

Figure 1:
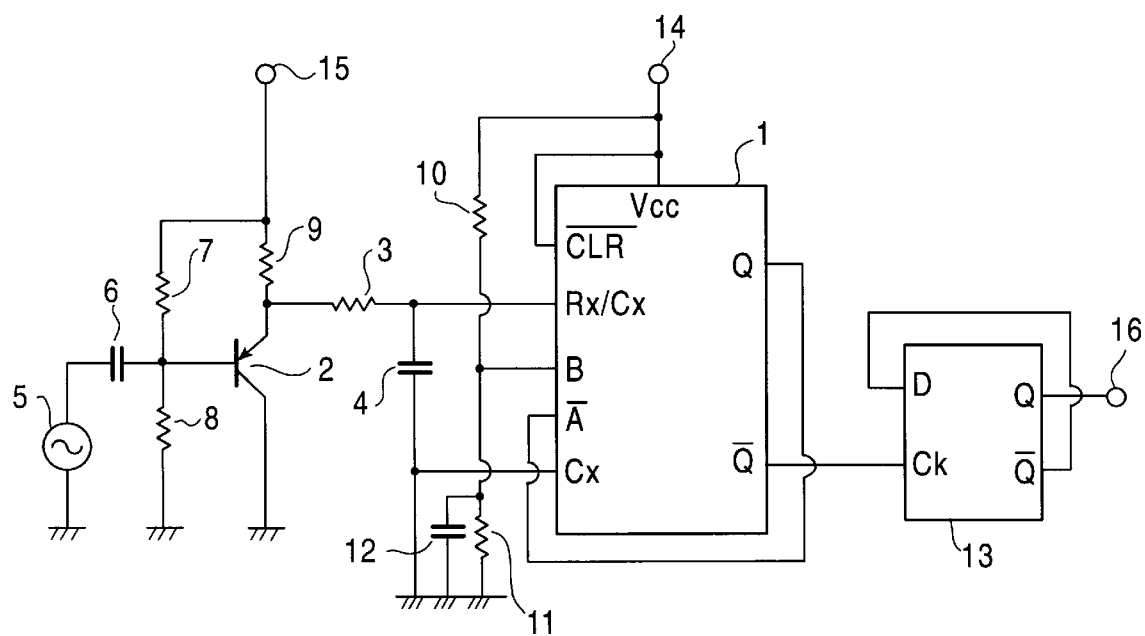
FIG. 1 is a circuit diagram showing the arrangement of a frequency modulation circuit according to an embodiment of the present invention.
Figure 2:
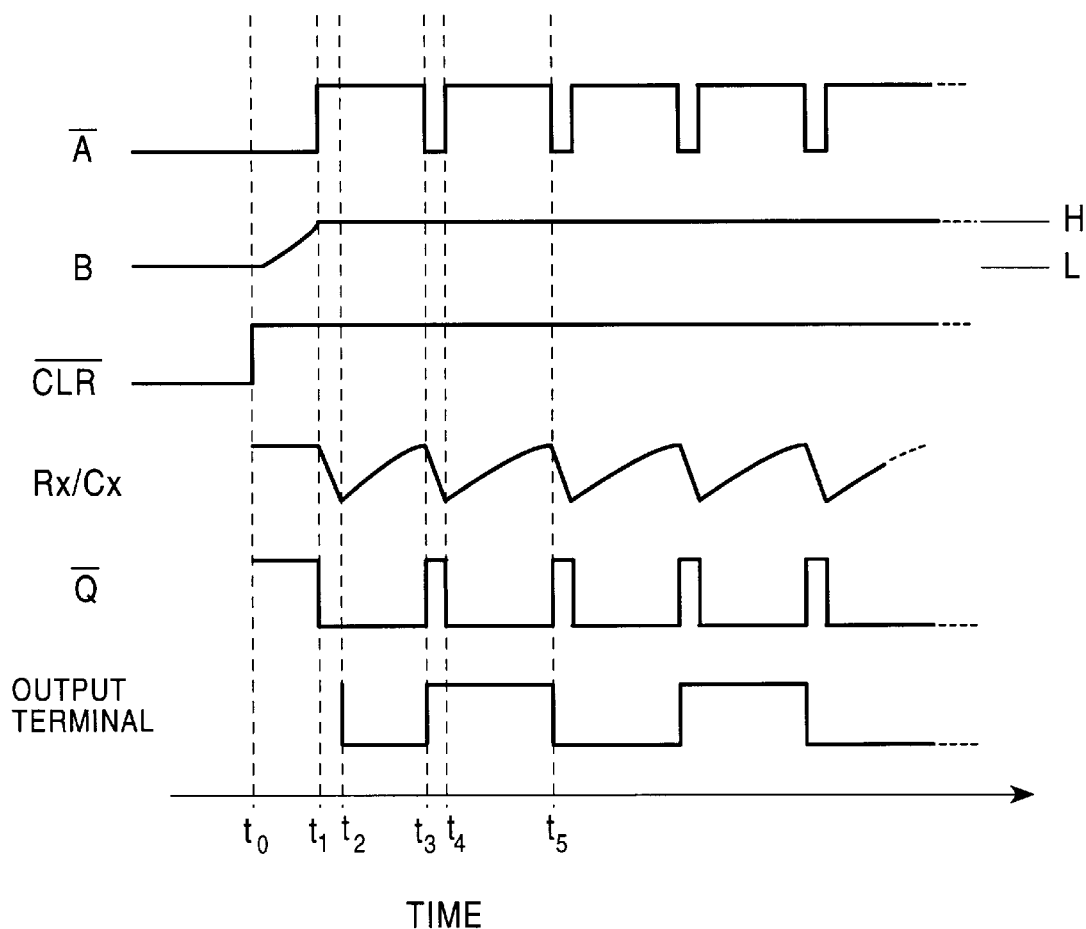
FIG. 2 is a waveform chart showing the signal states of respective portions of the frequency modulation circuit shown in FIG. 1 when the frequency modulation circuit operates.

FIG. 1 is a circuit diagram showing the arrangement of a frequency modulation circuit according to an embodiment of the present invention, and FIG. 2 is a waveform chart showing the signal states of respective portions of the frequency modulation circuit shown in FIG. 1 when the frequency modulation circuit operates.

As shown in FIG. 1, the frequency modulation circuit comprises an integrated mono-stable multi-vibrator 1, an emitter-follower connection transistor 2, a modulation signal source 5, and a D flip-flop 13. In this case, the transistor 2 has: a base connected to the output terminal of the modulation signal source 5 through a coupling capacitor 6, a second power supply terminal 15 through a first base-bias resistor 7, and the ground point through a second base-bias resistor 8; a collector directly connected to the ground point; and an emitter connected to the second power supply terminal 15 through an emitter resistor 9. In the integrated mono-stable multi-vibrator 1, a resistor/capacitor terminal $R_X/C_X$ is connected to the emitter of the transistor 2 through a resistor 3 and connected to a capacitor terminal $C_X$ through a capacitor 4; an inversion trigger terminal (A*) is connected to one complementary output terminal Q; a non-inversion trigger terminal B is connected to a first power supply terminal 14 through a first voltage set resistor 10 and connected to the ground point through a parallel connection circuit constituted by a second voltage set resistor 11 and a bypass capacitor 12; the capacitor terminal $C_X$ is connected to the ground point; and an inversion clear terminal (CLR*) and a power supply terminal $V_{CC}$ are connected to the first power supply terminal 14. In the D flip-flop 13, a clock terminal $C_K$ is connected to the other complementary output terminal (Q*) of the integrated mono-stable multi-vibrator 1, a delay terminal D is connected to the other complementary output terminal (Q*), and one complementary output terminal Q is connected to a signal output terminal 16.

In this case, a second power supply voltage $V_{CC2}$ supplied to the second power supply terminal 15 is selected to be higher than a first power supply voltage $V_{CC1}$ supplied to the first power supply terminal 14. For example, when the first power supply voltage $V_{CC1}$ is 5 V, the second power supply voltage $V_{CC2}$ is selected to be about 12 V. A resistance $R_{10}$ of the first voltage set resistor 10 and the resistance $R_{11}$ of the second voltage set resistor 11 are selected to satisfy $R_{10} << R_{11}$. As a result, after the power supply is turned on, a voltage set to the non-inversion trigger terminal B increases by a time constant determined by the resistance $R_{10}$ and a capacitance $C_{12}$ of the capacitor 12. After the voltage increases, the voltage goes to high level (H).

Here, the operation of the frequency modulation circuit according to this embodiment will be described below with reference to FIG. 2.

At time $t_0$, when the first power supply voltage $V_{CC1}$ and the second power supply voltage $V_{CC2}$ are applied, the voltage of the non-inversion trigger terminal B gradually increases from a voltage zero (0) state by a time constant determined by the resistance $R_{10}$ and the capacitance $C_{12}$. The voltage increases to a voltage obtained by dividing the first power supply voltage $V_{CC1}$ by the first voltage set resistor 10 and the second voltage set resistor 11. At this time, the first complementary output terminal Q and the inversion trigger terminal (A*) are at low level (L), and the second complementary output terminal (Q*) and the inversion clear terminal (CLR*) are at high level (H). The resistor/capacitor terminal $R_X/C_X$ is set in a high-impedance state, and the voltage of the resistor/capacitor terminal $R_X/C_X$ increases with time through a time constant, which is determined by a resistance $R_3$ of the resistor 3 and the capacitance $C_4$ of the capacitor 4, of a modulation voltage dependent voltage obtained at the emitter of the emitter-follower connection transistor 2. In this case, the time constant determined by the resistance $R_3$ and the capacitance $C_4$ and the time constant determined by the resistance $R_{10}$ and the capacitance $C_{12}$ are set to satisfy the condition: $R_3 \cdot C_4 << R_{10} \cdot C_{12}$.

At time $t_1$, when the voltage of the non-inversion trigger terminal B increases from low level (L) to high level (H), the resistor/capacitor terminal $R_X/C_X$ shifts to the low-impedance state, the levels of the first complementary output terminal Q and the inversion trigger terminal (A*) are converted from low level (L) into high level (H), and the level of the second complementary output terminal (Q*) is converted from high level (H) into low level (L). With the shift of the resistor/capacitor terminal $R_X/C_X$ to the low-impedance state, the voltage of the resistor/capacitor terminal $R_X/C_X$ sharply decreases with time. At this time, as described above, the voltage of the non-inversion trigger terminal B becomes a voltage equal to a voltage obtained by dividing the first power supply voltage $V_{CC1}$ by the first voltage set resistor 10 and the second voltage set resistor 11, i.e., a high-level (H) voltage, and, afterward, the voltage of the non-inversion trigger terminal B is kept at high level (H).

Subsequently, at time $t_2$, when the voltage of the resistor/capacitor terminal $R_X/C_X$ decreases to reach a low-voltage-side set voltage VrefL which is slightly higher than the ground voltage set in the integrated mono-stable multi-vibrator 1, the resistor/capacitor terminal $R_X/C_X$ shifts to a high-impedance state, and the voltage of the resistor/capacitor terminal $R_X/C_X$ gradually increases by a charge time constant of a modulation voltage dependent voltage determined by the resistor 3 and the capacitor 4.

At time $t_3$, when the gradually increasing voltage of the resistor/capacitor terminal $R_X/C_X$ reaches the high-voltage-side set voltage VrefH as described above, the resistor/capacitor terminal $R_X/C_X$ shifts to a low-impedance state. At the same time, the levels of the first complementary output terminal Q and the inversion trigger terminal (A*) are converted from high level (H) into low level (L), and the level of the second complementary output terminal (Q*) is converted from low level (L) into high level (H). With the shift of the resistor/capacitor terminal $R_X/C_X$ to the low-impedance state, the voltage of the resistor/capacitor terminal $R_X/C_X$ sharply decreases.

At time $t_4$, when the voltage of the resistor/capacitor terminal $R_X/C_X$ decreases to reach the low-voltage-side set voltage VrefL, the resistor/capacitor terminal $R_X/C_X$ shifts to a high-impedance state, and the voltage of the resistor/capacitor terminal $R_X/C_X$ gradually increases by the charge time constant of the modulation voltage dependent voltage determined by the resistor 3 and the capacitor 4.

Subsequently, at time $t_5$, the gradually increasing voltage of the resistor/capacitor terminal $R_X/C_X$ reaches the high-voltage-side set voltage VrefH, the resistor/capacitor terminal $R_X/C_X$ shifts to a low-impedance state. At the same time, the levels of the first complementary output terminal Q and the inversion trigger terminal (A*) are converted from high level (H) into low level (L), and the level of the second complementary output terminal (Q*) is converted from low level (L) into high level (H). With the shift of the resistor/capacitor terminal $R_X/C_X$ to the low-impedance state, the voltage of the resistor/capacitor terminal $R_X/C_X$ sharply decreases.

Thereafter, when the voltage of the resistor/capacitor terminal $R_X/C_X$, reaches the low-voltage-side set voltage VrefL or the high-voltage-side set voltage VrefH, the resistor/capacitor terminal $R_X/C_X$ shifts to a high-impedance state or a low-impedance state. With these shifts, the levels of the first complementary output terminal Q and the inversion trigger terminal (A*) are converted from low level (L) into high level (H) or from high level (H) into low level (L), and the level of the second complementary output terminal (Q*) is converted from high level (H) into low level (L) or low level (L) into high level (H). The above operation is repetitively executed.

The D flip-flop 13 is triggered by the rise edge of a pulse output from the second complementary output terminal (Q*) of the integrated mono-stable multi-vibrator 1 when the level of the pulse is converted from low level (L) into high level (H), and a pulse signal which rises at one rise edge of the pulse and falls at the next rise edge of the pulse is obtained from the second complementary output terminal (Q*), and is supplied to the signal output terminal 16.

In this case, the voltage of the resistor/capacitor terminal $R_X/C_X$ gradually increases by the charge time constant of the modulation voltage dependent voltage determined by the resistor 3 and the capacitor 4 as described above, and the rate of the increase is high as the modulation voltage dependent voltage is high, i.e., a modulation signal generated by the modulation signal source 5 is large. As the time until the voltage reaches the high-voltage-side set voltage VrefH becomes short, a time for which the second complementary output terminal (Q*) is kept at low level (L) becomes short, and the cycle of a pulse signal supplied to the signal output terminal 16 becomes short. For this reason, a frequency modulation signal depending on the modulation signal is output to the signal output terminal 16.

Figure 3:
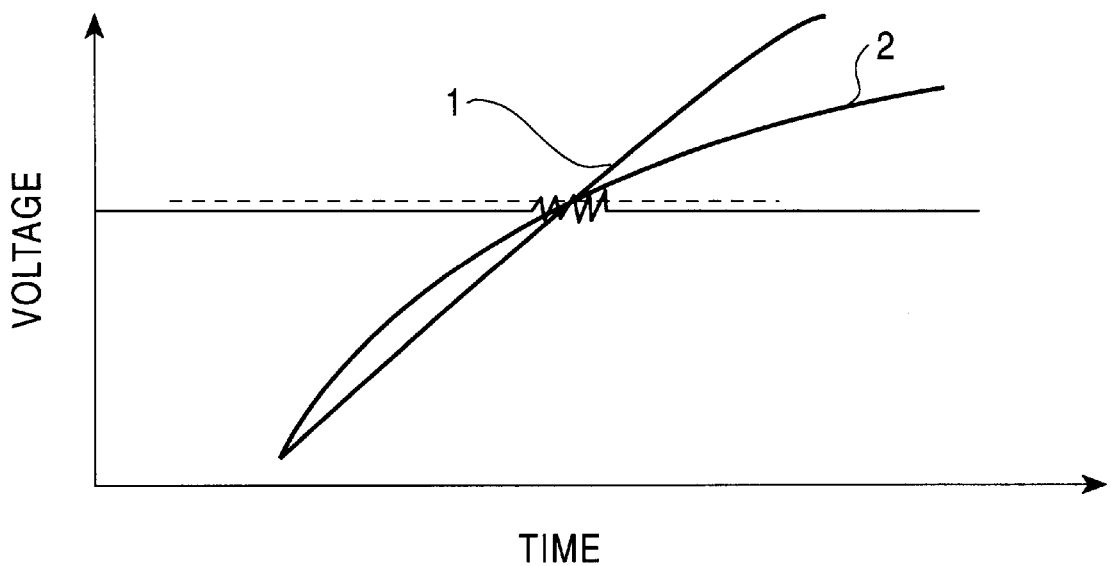
FIG. 3 is a graph for explaining an operation in a state wherein the gradually increasing voltage of the resistor/capacitor terminal $R_X/C_X$ crosses a high-voltage-side set voltage VrefH.
Figures 4A, 4B:
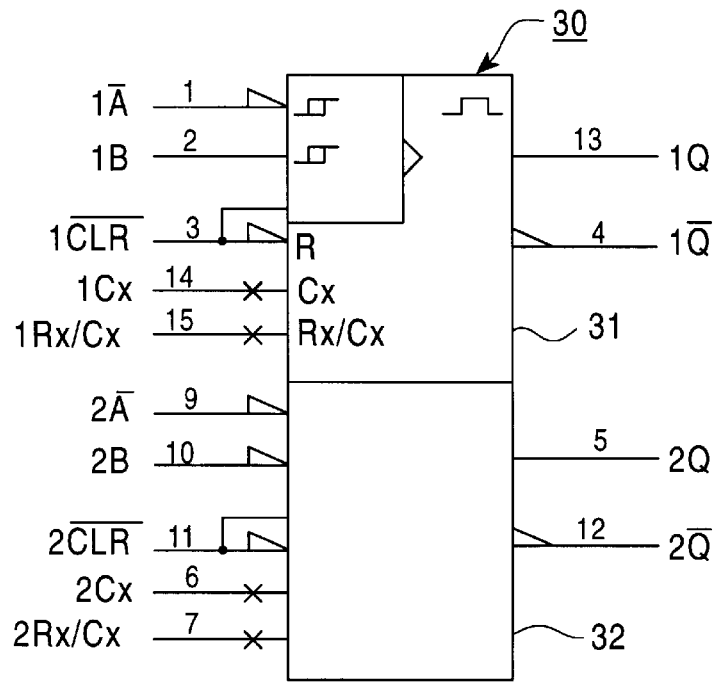
FIG. 4A is a view showing the arrangement of an integrated mono-stable multi-vibrator used in a known mono-stable multi-vibrator circuit.
FIG. 4B is a truth table for the device of FIG. 4A.
Figure 5:
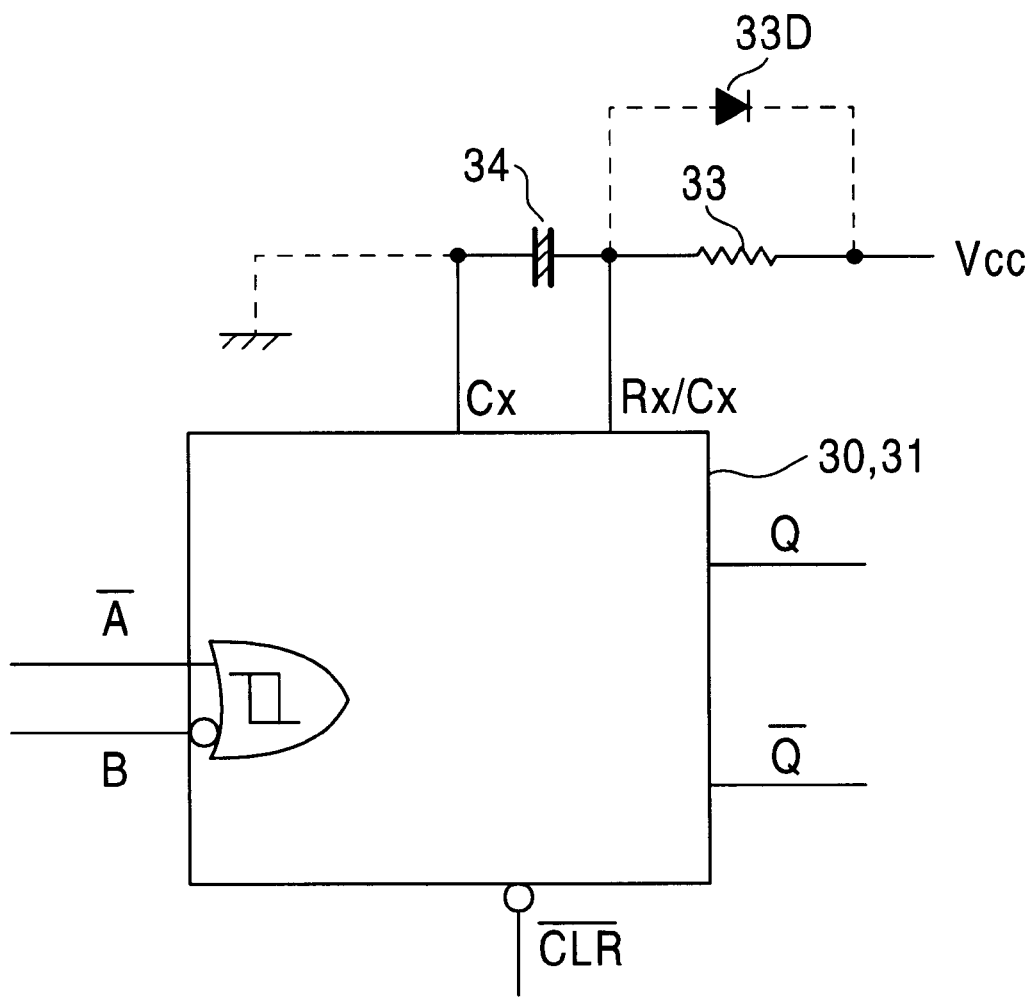
FIG. 5 is a view showing the arrangement of a main part of a mono-stable multi-vibrator circuit constituted by the mono-stable multi-vibrator shown in FIG. 4A.
Figure 6:
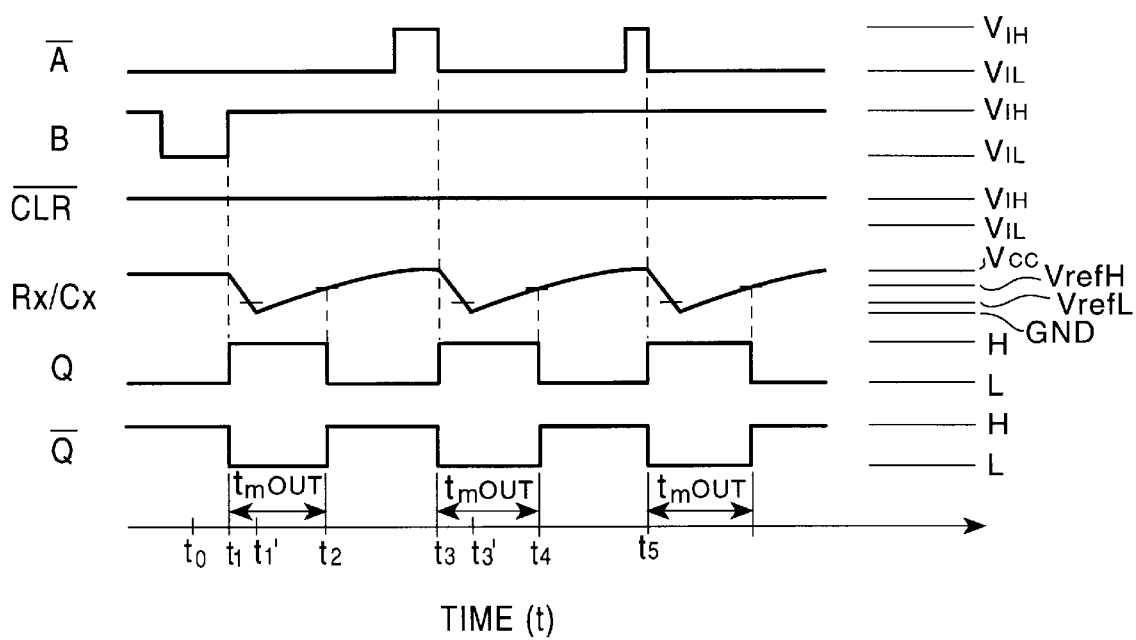
FIG. 6 is a waveform chart showing signal change states of respective portions of the mono-stable multi-vibrator circuit shown in FIG. 5 when the mono-stable multi-vibrator circuit operates.
Figure 7:
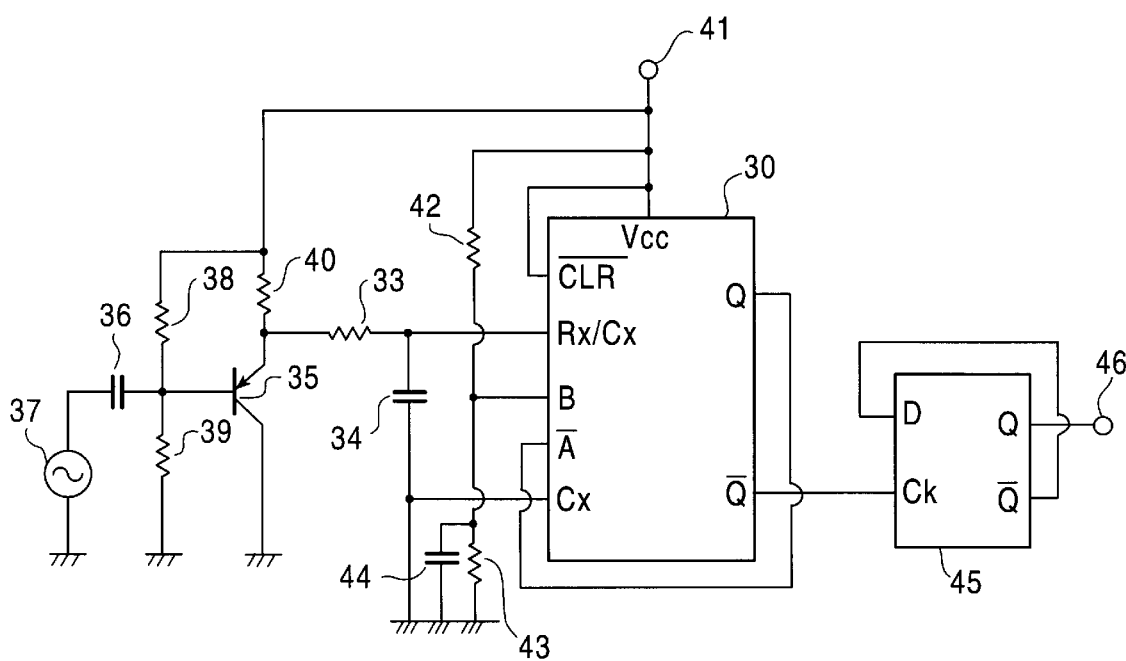
FIG. 7 is a circuit diagram showing a known frequency modulation circuit constituted by the mono-stable multi-vibrator circuit shown in FIG. 5.

Here, FIG. 3 is a graph for explaining an operation in a state wherein the gradually increasing voltage of the resistor/capacitor terminal $R_X/C_X$ crosses a high-voltage-side set voltage VrefH.

Referring to FIG. 3, the abscissa represents time, and the ordinate represents a voltage. A curve 1 indicates a voltage obtained by a frequency modulation circuit according to this embodiment, and a curve 2 indicates a voltage obtained by a known frequency modulation circuit for comparison.

As indicated by the curve 1 in FIG. 3, in the frequency modulation circuit according to this embodiment, the second power supply voltage $V_{CC2}$ for driving the emitter of the transistor 2 is selected to be higher than the first power supply voltage $V_{CC1}$ for driving the integrated mono-stable multi-vibrator 1. For example, when the first power supply voltage $V_{CC1}$ is set to 5 V, the second power supply voltage $V_{CC2}$ is selected to be about 12 V. For this reason, when the gradually increasing voltage of the resistor/capacitor terminal $R_X/C_X$ crosses the high-voltage-side set voltage VrefH, the rate of the gradually increase is considerably higher in the curve 1 than in the curve 2 in FIG. 3. An inclination angle at which the voltage crosses the high-voltage-side set voltage VrefH is considerably larger in the curve 1 than in the curve 2 in FIG. 3.

When induction noise is superposed on the high-voltage-side set voltage VrefH, a curve 2 which crosses the high-voltage-side set voltage VrefH at a gentle inclination angle is influenced for a long time by a variation of the high-voltage-side set voltage VrefH caused by superposing the induction noise on the high-voltage-side set voltage VrefH. When the high-voltage-side set voltage VrefH slightly varies, the coincidence point between the increasing voltage and the high-voltage-side set voltage VrefH is slightly different from the coincident point between the increasing voltage and the original high-voltage-side set voltage VrefH, and a frequency modulation signal with a modulation error is obtained. On the other hand, the curve 1 which crosses the high-voltage-side set voltage VrefH at a sharp inclination angle is influenced for a short time by a variation of the high-voltage-side set voltage VrefH caused by superposing induction noise on the high-voltage-side set voltage VrefH. Even if the high-voltage-side set voltage VrefH slightly varies, the coincidence point between the increasing voltage and the high-voltage-side set voltage VrefH is not different from the coincidence point between the increasing voltage and the original high-voltage-side set voltage VrefH, a frequency modulation signal being free from a modulation error can be obtained.

In this manner, according to this embodiment, by only making the second power supply voltage for driving the emitter of the emitter-follower connection transistor 2 higher than the first power supply voltage for driving the integrated mono-stable multi-vibrator 1, the influence of induction noise superposed on the high-voltage-side set voltage VrefH can be prevented. Therefore, a frequency modulation signal being free from a modulation error can be obtained.

In the above embodiment, the case wherein the first power supply voltage and the second power supply voltage are respectively set to 5 V and 12 V is described. The voltage value of the first power supply voltage and the voltage value of the second power supply voltage are not limited to the above specific values. When the second power supply voltage is higher than the first power supply voltage, arbitrary voltage values may be selected as the first and second power supply voltages, respectively.

As has been described above, according to the present invention, a modulation signal dependent voltage obtained from the emitter of the emitter-follower connection transistor is applied to the integrated mono-stable multi-vibrator as an increasing voltage through a time constant determined by a resistor and a capacitor, and the modulation signal dependent voltage is compared with the high-voltage-side set voltage of the integrated mono-stable multi-vibrator. In this case, even if induction noise is superposed on the high-voltage-side set voltage to cause the high-voltage-side set voltage to vary in correspondence with the induction noise, the second power supply voltage for driving the emitter of the transistor is selected to be higher than the first power supply voltage for driving the integrated mono-stable multi-vibrator. For this reason, the modulation signal dependent voltage increases, and the increase rate of the increasing voltage becomes high. More specifically, since an inclination angle at which the increasing voltage crosses the high-voltage-side set voltage on which in the induction noise is superposed increases, the increasing voltage reaches the high-voltage-side set voltage. Conversion of the level of the complementary output terminal is not easily influenced by a slight variation of the high-voltage-side set voltage on which the induction noise is superposed, and modulation error of the frequency modulation signal can be advantageously reduced.

What is claimed is:

1. A frequency modulation circuit comprising: an emitter-follower connection transistor, having a base supplied with a modulation signal, for generating an emitter voltage which is in proportion to a change in level of the modulation signal; and an integrated mono-stable multi-vibrator having an inversion trigger terminal, a non-inversion trigger terminal, a resister/capacitor terminal, a capacitor terminal, an inversion clear terminal, complementary output terminals, and a power supply terminal, characterized in that said inversion trigger terminal is connected one of said complementary output terminals, said non-inversion trigger terminal is connected to a partial voltage point of partial voltage resistors connected between said power supply terminal and a reference potential point, said capacitor/resistor terminal is connected to the emitter of said transistor through a resistor and connected to said capacitor terminal through a capacitor, said inversion clear terminal and said power supply terminal are connected to a first power supply, a load is connected to the other of said complementary output terminals, and the emitter of said transistor is driven by a second power supply which generates a voltage higher than an output voltage from said first power supply.

2. A frequency modulation circuit according to claim 1, characterized in that, in said partial voltage resistors, a resistance of a first resistor connected to said power supply terminal is selected to be higher than a resistance of a second resistor connected to said reference potential point, and a bypass capacitor is connected in parallel to said second resistor.

3. A frequency modulation circuit according to claim 1, characterized in that said load is constituted by a flip-flop circuit which multiplies an input signal frequency.

* * * * *